(12) United States Patent
Haratani et al.

(10) Patent No.: US 7,948,349 B2
(45) Date of Patent: May 24, 2011

(54) MAGNETIC COUPLER

(75) Inventors: Susumu Haratani, Tokyo (JP); Hitoshi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 281 days.

(21) Appl. No.: 12/289,384

(22) Filed: Oct. 27, 2008

(65) Prior Publication Data

US 2009/0121819 A1 May 14, 2009

(30) Foreign Application Priority Data

Oct. 31, 2007 (JP) ................................ 2007-284507

(51) Int. Cl.
*H01F 17/04* (2006.01)

(52) U.S. Cl. ........ 336/221; 336/200; 336/232; 324/249; 324/252

(58) Field of Classification Search .................. 336/200, 336/223, 232, 221; 324/249, 252
See application file for complete search history.

(56) References Cited

U.S. PATENT DOCUMENTS

| | | | | |
|---|---|---|---|---|
| 4,849,695 A * | 7/1989 | Muller et al. | | 324/252 |
| 5,583,436 A * | 12/1996 | Van De Walle et al. | | 324/252 |
| 5,952,852 A * | 9/1999 | McGowan et al. | | 326/106 |
| 6,356,079 B1 * | 3/2002 | Mizoguchi et al. | | 324/249 |
| 6,529,114 B1 * | 3/2003 | Bohlinger et al. | | 338/32 R |
| 6,750,751 B2 * | 6/2004 | Wan | | 336/200 |
| 7,046,117 B2 * | 5/2006 | Wan | | 338/32 R |
| 7,321,283 B2 * | 1/2008 | Mehrotra et al. | | 336/200 |
| 7,358,722 B2 * | 4/2008 | Peczalski et al. | | 324/247 |
| 7,501,928 B2 | 3/2009 | Shoji | | |
| 7,518,354 B2 * | 4/2009 | Stauth et al. | | 324/117 R |

FOREIGN PATENT DOCUMENTS

| | | |
|---|---|---|
| JP | A-62-040786 | 2/1987 |
| JP | A-2001-093763 | 4/2001 |
| JP | A-2001-094174 | 4/2001 |
| JP | A-2001-135534 | 5/2001 |
| JP | A-2001-135535 | 5/2001 |
| JP | A-2001-135536 | 5/2001 |
| JP | A-2001-135537 | 5/2001 |
| JP | A-2001-196250 | 7/2001 |
| JP | A-2003-526083 | 9/2003 |
| JP | A-2006-153697 | 6/2006 |
| WO | WO 99/45405 | 9/1999 |
| WO | WO 2006/098372 A1 | 9/2006 |

OTHER PUBLICATIONS

Oct. 21, 2009 Office Action issued in Japanese Application No. 2007-284507.

* cited by examiner

*Primary Examiner* — Anh T Mai
*Assistant Examiner* — Joselito Baisa
(74) *Attorney, Agent, or Firm* — Oliff & Berridge, PLC

(57) ABSTRACT

A magnetic coupler having higher response is provided. The magnetic coupler includes a thin film coil wound in a first layer; a first MR element being disposed in a second layer, and detecting an induced magnetic field generated by a signal current flowing through the thin film coil; and yokes being disposed close to the first MR element, and including a soft magnetic material. The first MR element is disposed in a position corresponding to a linear region of the thin film coil in a stacking direction. The yokes are disposed at both of an inner turn side and an outer turn side of the thin film coil in a manner of interposing the first MR element in the second layer. Thus, reduction in intensity of the induced magnetic field is suppressed, and intensity distribution of the induced magnetic field becomes flatter.

13 Claims, 12 Drawing Sheets
(4 of 12 Drawing Sheet(s) Filed in Color)

MAGNETIC COUPLER

CROSS REFERENCES TO RELATED APPLICATIONS

The present invention contains subject matter related to Japanese Patent Application JP 2007-284507 filed in the Japanese Patent Office on Oct. 31, 2007, the entire contents of which being incorporated herein by reference.

BACKGROUND OF THE INVENTION

1. Field of the Invention

The present invention relates to a magnetic coupler having a thin film coil and magnetoresistive elements, and performing signal transmission in a contactless manner between a plurality of electric circuits isolated from one another.

2. Background Art

As a device for transmitting a signal in a contactless manner from one electric circuit to the other circuit among a plurality of electric circuits isolated from one another, a photo-coupler or a pulse transformer has been known in the past. However, significant aging deterioration occurs in the photo-coupler, including deterioration due to consumption of a light emitting diode (LED), or reduction in current transmission rate, in addition, significant delay in signal transmission. On the other hand, since the pulse transformer uses a winding coil, signal transmission delay is small therein. However, the pulse transformer has a problem of large size or weight, and a low operable temperature. In some coupler, the winding coil of the pulse transformer is substituted by a thin film coil. However, the coil does not efficiently receive a magnetic field, resulting in increase in power consumption.

Thus, a magnetic coupler has been developed for overcoming the difficulty (for example, refer to Published Japanese Translation of a PCT patent application No. 2003-526083, and Japanese Unexamined Patent Publication Nos. 2001-94174, 2001-135534, 2001-135535, 2001-135536, 2001-135537, 2001-196250, 2001-93763, and 62-40786). The magnetic coupler detects change in current, flowing through a signal line from one electric circuit system, in a contactless manner, and transmits an electric signal to the other electric circuit system. Therefore, the magnetic coupler is now noted as a device having an excellent operational reliability while having a simple configuration.

SUMMARY OF THE INVENTION

However, such a magnetic coupler is recently required to have further improved operational reliability, in addition, advanced power saving, and high sensitivity.

In view of foregoing, it is desirable to provide a magnetic coupler having higher response.

A first magnetic coupler of an embodiment of the invention includes a thin film coil wound in a first layer, one or more magnetoresistive elements located in a second layer different from the first layer to detect an induced magnetic field generated by a current flowing through the thin film coil, and one or more yokes disposed adjacent to the magnetoresistive elements in a radial direction of the thin film coil. Here, the above description that the magnetoresistive elements are located in the second layer different from the first layer means that even if the thin film coil is extended to infinite distance along extent of the first layer, the thin film coil is not overlapped with each of the magnetoresistive elements. In this case, each of the thin film coil and the magnetoresistive elements may occupy the whole region or a partial region in a thickness direction of each of the first and second layers respectively. Moreover, the first and second layers may be adjacent to or separated from each other. The radial direction of the thin film coil is a direction along which an inner turn side of the thin film coil is connected to an outer turn side thereof, in addition, a direction perpendicular to a winding direction.

A second magnetic coupler of an embodiment of the invention includes a thin film coil wound in a first layer, first to fourth magnetoresistive elements located in a second layer different from the first layer, and having resistance values which are variable depending on an induced magnetic field generated by a current flowing through the thin film coil respectively, and one or more yokes disposed adjacent to the first to fourth magnetoresistive elements in a radial direction of the thin film coil, where a resistance value of each of the first and second magnetoresistive elements changes in a direction opposite to an up-down direction of a resistance value of the third and fourth magnetoresistive elements, respectively, in response to changes of the induced magnetic field.

In the first and second magnetic couplers of an embodiment of the invention, since the yokes exist in positions adjacent to the magnetoresistive elements in the radial direction of the thin film coil respectively, reduction in intensity of an induced magnetic field generated by the thin film coil is suppressed, and consequently the induced magnetic field is efficiently applied to the magnetoresistive elements. Particularly, in the second magnetic coupler, since the first to fourth magnetoresistive elements are provided, the elements are interconnected into bridge connection so that change in current flowing through the thin film coil is further accurately detected.

In the first magnetic coupler of an embodiment of the invention, preferably, the thin film coil has a linear region including a plurality of linear patterns which linearly extends in a winding direction of the thin film coil, and each of the magnetoresistive elements is provided in a position corresponding to the linear region. This is because operation of the coupler is further significantly stabilized. The stacking direction described herein is a direction perpendicular to a plane along which each of the first and second layers extends.

In the first magnetic coupler of an embodiment of the invention, the yokes are desirably disposed at both side of the magnetoresistive elements, that is, at an inner turn side and an outer turn side of the thin film coil, with the magnetoresistive elements in between. This is because an induced magnetic field generated by the thin film coil is further efficiently applied to the magnetoresistive element. In such a case, in the radial direction of the thin film coil, when a distance from the yoke at the inner turn side to a middle point is smaller than a distance from the yoke at the outer turn side to the middle point, the middle point being defined as a median point between an innermost turn edge and an outermost turn edge of the thin film coil, an induced magnetic field, being small in deviation of intensity distribution in the radial direction, is applied to the magnetoresistive element. In addition, in the radial direction of the thin film coil, the yoke at the inner turn side is located at an outer turn side of the innermost turn edge of the thin film coil, or an inner side edge of the yoke at the outer turn side is located at an inner side of the outermost turn edge of the thin film coil, resulting in reduction in deviation in intensity distribution of the induced magnetic field in the radial direction.

In the first magnetic coupler of an embodiment of the invention, the yokes are preferably disposed in the second layer as in the case of the magnetoresistive elements. This is because the induced magnetic field generated by the thin film coil is efficiently applied to the magnetoresistive elements compared with a case that yokes are disposed in a layer different from a layer having the magnetoresistive elements.

In the first magnetic coupler of an embodiment of the invention, when each yoke has a magnetization easy axis in a direction along a winding direction of the thin film coil, the yoke is easily magnetized by an induced magnetic field generated by the thin film coil, and consequently the yoke further efficiently guides the induced magnetic field to each of the magnetoresistive elements. In such a case, the yoke preferably extends such that a longitudinal direction of the yoke corresponds to the winding direction of the thin film coil, for example, extends in a manner of forming a rectangular shape. This is because a magnetization easy axis of the yoke is stabilized due to shape magnetic anisotropy. Moreover, when a yoke further has an antiferromagnetic layer having spin in a direction along the magnetization easy axis of the yoke, the yoke tends to have a single-domain structure, thereby bad influence due to magnetic hysteresis of the yoke itself is suppressed. Alternatively, a ferromagnetic layer for applying a bias magnetic field to a yoke in a direction along a magnetization easy axis of the yoke may be provided to achieve the single-domain structure of the yoke.

In the first magnetic coupler of an embodiment of the invention, the yokes may include a plurality of yoke patterns dividedly arranged to be adjacent to one another in the radial direction of the thin film coil, each of the yoke patterns extending along the winding direction of the thin film coil. In such a case, shape magnetic anisotropy of the yoke as a whole is improved compared with a case that a yoke does not include the divided patterns, thereby an induced magnetic field to be applied to the magnetoresistive element is expected to be stabilized.

In the first magnetic coupler of an embodiment of the invention, each of the yokes preferably has a stacked structure having soft magnetic layers and insulating layers alternately stacked in the stacking direction. This is because while a certain degree of magnetic volume (magnetic thickness) is secured, generation of a demagnetization field is suppressed. Moreover, to improve sensitivity of detecting an induced magnetic field, a magnetoresistive element may be used, which has a plurality of strip-shaped patterns connected in series to one another, the strip-shaped patterns extending along a winding direction or in the radial direction of the thin film coil.

According to the first and second magnetic couplers of an embodiment of the invention, each yoke is disposed at a position at which the yoke is adjacent to a magnetoresistive element in a radial direction of a thin film coil, which suppresses reduction in intensity of an induced magnetic field generated by the thin film coil, so that the induced magnetic field can be efficiently applied to the magnetoresistive element. Accordingly, even if a smaller current is flowed into the thin film coil, the induced magnetic field can be accurately detected. Therefore, signal transmission between a plurality of electric circuits isolated from one another can be performed in a contactless manner with reduced power consumption. Particularly, according to the second magnetic coupler, since the first to fourth magnetoresistive elements are provided, the elements are interconnected into bridge connection and thus change in current flowing through the thin film coil can be further accurately detected.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF THE PREFERRED EMBODIMENTS

Hereinafter, a preferred embodiment of the invention will be described in detail with reference to drawings.

First Embodiment

Figure 1:
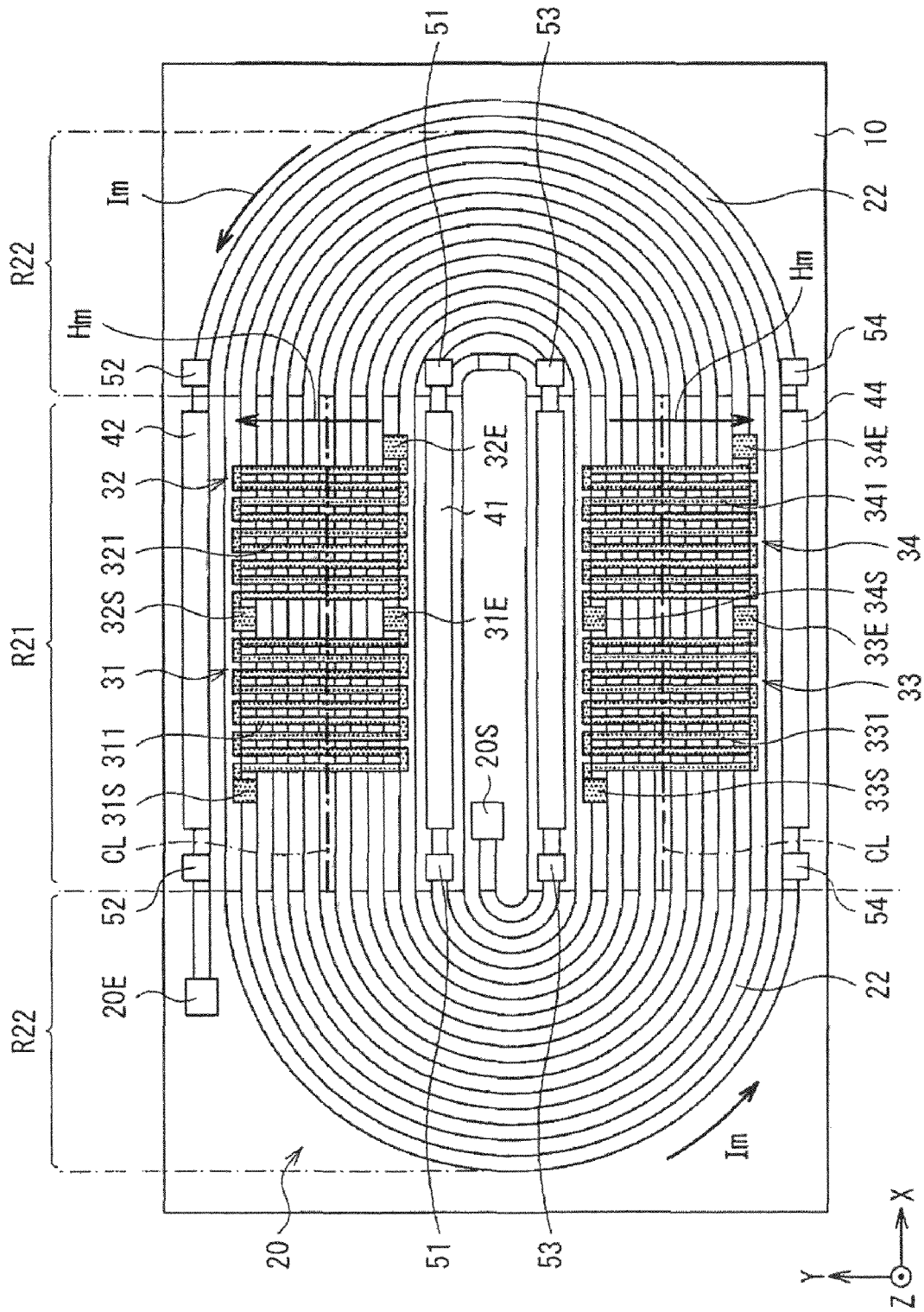
FIG. 1 shows a plan view showing a configuration of a magnetic coupler as a first embodiment of the invention.
Figure 2A:
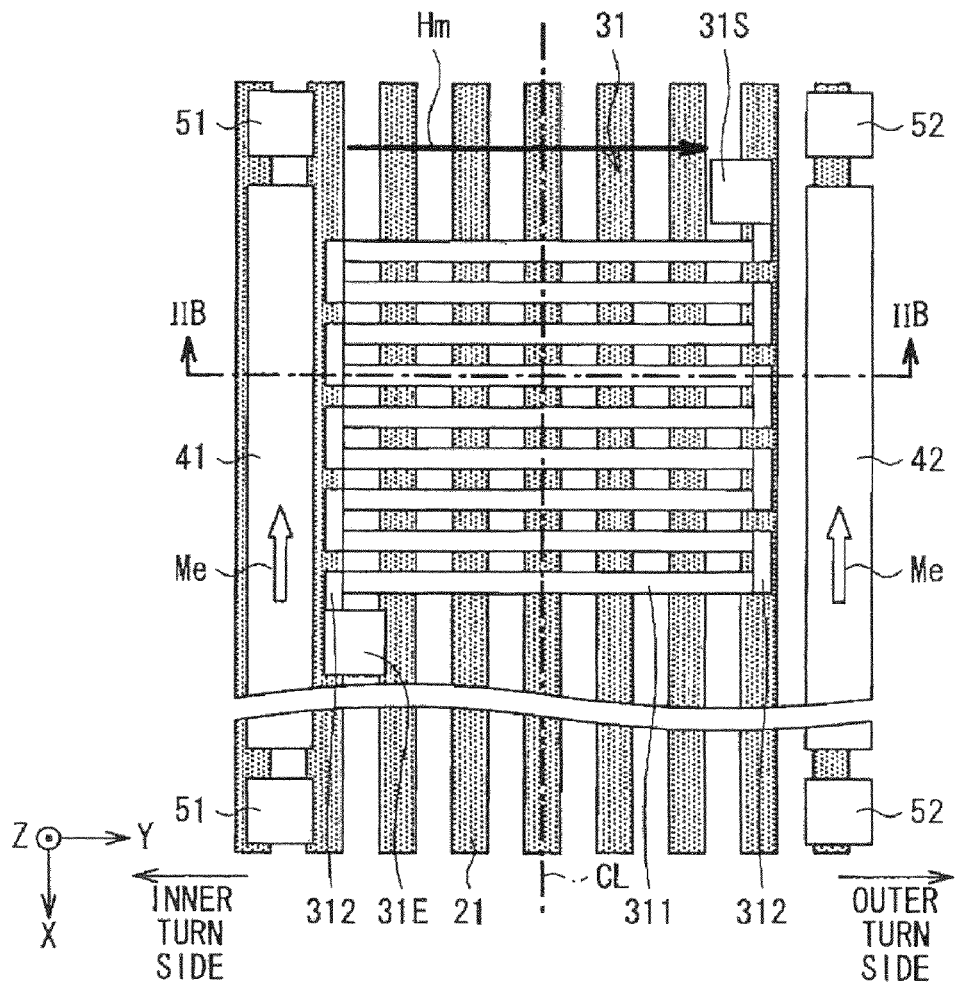
FIGS. 2A to 2B show an enlarged plan view and an enlarged section view of a relevant part of the magnetic coupler shown in FIG. 1 respectively.
Figure 2B:
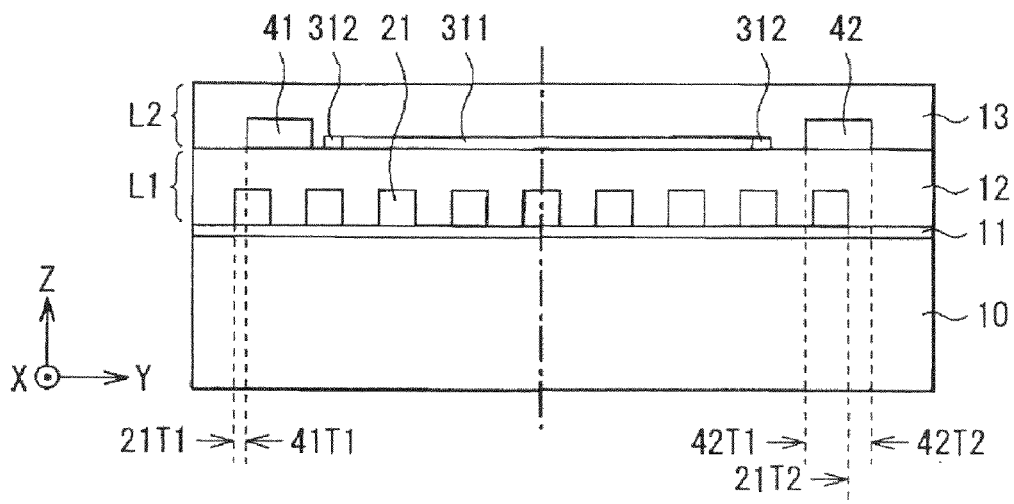

First, a configuration of a magnetic coupler as a first embodiment of the invention is described with reference to FIG. 1 and FIGS. 2A to 2B. FIG. 1 shows a plan view showing a configuration of the magnetic coupler of the embodiment. FIG. 2A shows an enlarged plan view of a relevant part of the magnetic coupler shown in FIG. 1. FIG. 2B shows a section view seen in an arrow direction along a line IIB-IIB in FIG. 2A. An arrow direction of a signal current Im and an arrow direction of an induced magnetic field Hm indicate relative directions to magnetoresistive elements 31 to 34 (described later) respectively. The magnetic coupler is a device for transmitting a signal from an electric circuit to another electric circuit in an electrically contactless manner, and is an effective unit for cutting noises while transmitting a necessary signal.

As shown in FIG. 1, the magnetic coupler of the embodiment includes a thin film coil 20 wound in a first layer L1 (FIG. 2B) extending along an X-Y plane, first to fourth magneto-resistive effect (MR) elements 31 to 34 located in an area corresponding to the thin film coil 20 in a second layer L2 being an upper layer of the first layer L1, and yokes 41 to 44 disposed at an inner turn side and an outer turn side of the thin film coil 20 in the second layer L2. In the first layer L1, the thin film coil 20 is covered with an insulating layer 12, and in the second layer L2, both the yokes 41 to 44 and the first to fourth MR elements 31 to 34 are covered with an insulating layer 13 (FIG. 2(B)). In FIG. 1 and FIGS. 2A to 2B, a wiring pattern for interconnecting between the first to fourth MR elements 31 to 34 is omitted to be shown.

A base 10 is a rectangular substrate supporting the magnetic coupler as a whole, and includes glass, silicon (Si), aluminum oxide ($Al_2O_3$) or the like. An insulating layer 11 such as a silicon oxide ($SiO_2$) layer may be provided in a manner of covering the base 10.

The thin film coil 20, having two terminals 20S and 20E, is a thin film conductive layer being, for example, wound counterclockwise when the coil is seen from a second layer L2 side so as to be directed from the terminal 20S at the wound center side to the terminal 20E at the outer turn side. The thin film coil 20 is configured by a highly conductive material such as copper (Cu). An area where the thin film coil 20 is formed is classified into a pair of linear regions R21 and a pair of curved regions R22 connecting the linear regions. Each linear region R21 is an area occupied by a plurality of linear patterns 21, the linear patterns linearly extending along an X-axis direction, and being disposed with a predetermined interval in a Y-axis direction. One curved region R22 is an area occupied by a curved pattern 22 having a curved configuration formed in a manner of connecting between respective ends of the respective linear patterns 21. Here, the linear patterns 21 desirably have the same section area in a longitudinal direction (X-axis direction), and are identical with each other, and arranged with an interval equal to each other.

The first and second MR elements 31 and 32 are disposed in positions corresponding to the one linear region R21 in a stacking direction, and the third and fourth MR elements 33 and 34 are disposed in positions corresponding to the other linear region R21 in the stacking direction (refer to FIG. 1).

As shown in FIGS. 1 and 2A to 2B, the first MR element 31 has a plurality of strip-shaped patterns 311 connected in series to one another between the pair of terminals 31S and 31E. The strip-shaped patterns 311 extend in a radial direction (Y-axis direction) of the thin film coil 20, and are arranged adjacent to one another in a winding direction (X-axis direction) of the thin film coil 20. That is, the first MR element 31 is configured by the plurality of strip-shaped patterns 311 continuing to one another in a zigzag pattern via connection portions 312, the strip-shaped patterns being disposed parallel to one another such that a longitudinal direction of each pattern corresponds to the radial direction between the terminals 31S and 31E. The second to fourth MR elements 32 to 34 are in the same configuration as this. That is, each of the second to fourth elements 32 to 34 is configured by strip-shaped patterns 321, 331 or 341 being connected in series in a manner of continuing to one another in a zigzag pattern via connection portions (not shown) between a pair of terminals 32S and 32E, a pair of terminals 33S and 33E, or a pair of terminals 34S and 34E, respectively. While FIGS. 1 and 2A to 2B show a case that the first to fourth elements 31 to 34 have nine strip-shaped patterns respectively, the number of the patterns is not limited to nine.

When the strip-shaped patterns 311, 321, 331 and 341 of the first to fourth elements 31 to 34 is flowed with a certain read current, each of the strip-shaped patterns shows change in resistance value in accordance with an induced magnetic field Hm generated by a signal current Im flowing through the thin film coil 20. In such a case, a resistance value of each of the strip-shaped patterns 311 and 321 changes in an opposite direction to a resistance value of each of the strip-shaped patterns 331 and 341. That is, the following relationship is established between the resistance values: if the resistance values of the strip-shaped patterns 311 and 321 increase, the resistance values of the strip-shaped patterns 331 and 341 decrease. More specifically, when the signal current Im flows through the thin film coil 20 in a manner of directing from the terminal 20S to the terminal 20E, while the induced magnetic field Hm is applied in a +Y direction to the first and second MR elements 31 and 32, the induced magnetic field Hm is applied in a −Y direction to the third and fourth MR elements 33 and 34.

Figure 3A:
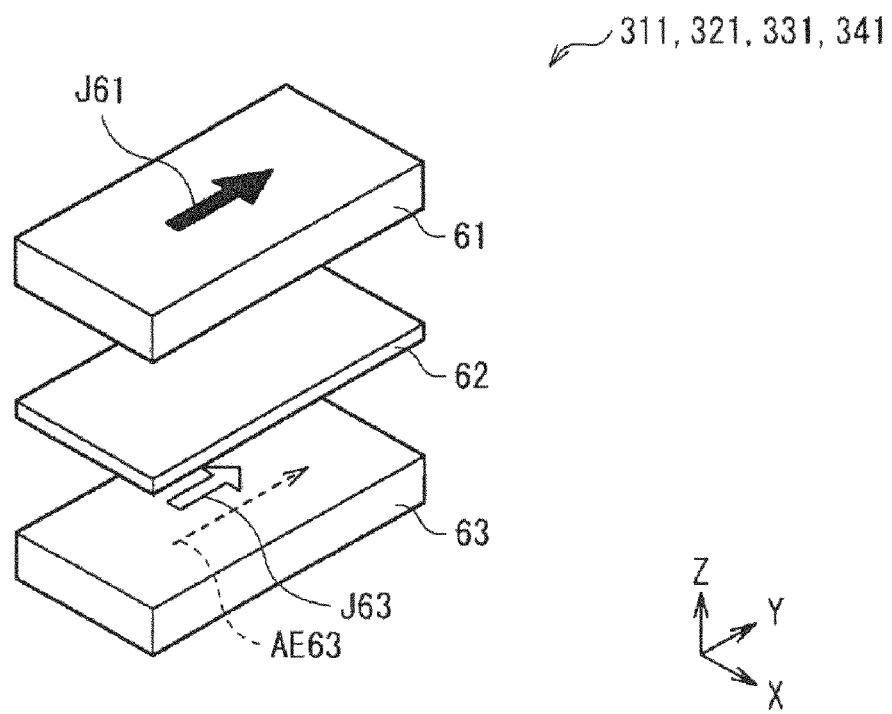
FIGS. 3A to 3B show exploded perspective views showing a configuration of a strip-shaped pattern of the magnetic coupler shown in FIG. 1, respectively.
Figure 3B:
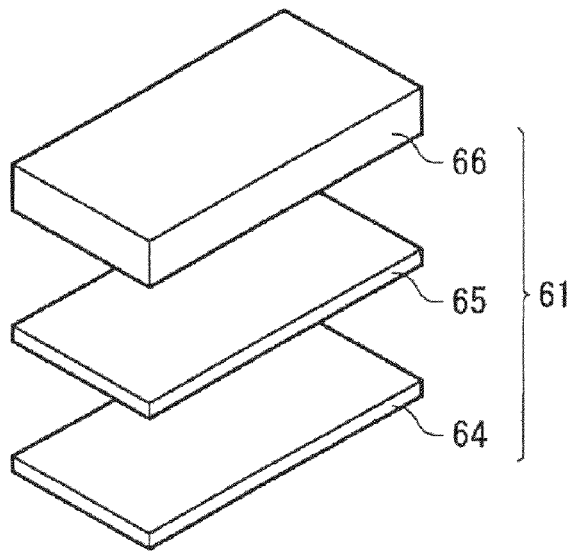

Next, a configuration of each of the strip-shaped patterns 311, 321, 331 and 341 is described in a more detailed manner with reference to FIGS. 3A to 3B. FIGS. 3A to 3B show exploded perspective views showing the configuration of each of the strip-shaped patterns 311, 321, 331 and 341 in an exploded manner. The strip-shaped patterns 311, 321, 331 and 341 have the same configuration.

Each of the strip-shaped patterns 311, 321, 331 and 341 has a spin-valve structure, and as shown in FIG. 3(A), the strip-shaped pattern is structured such that a pinned layer 61, which has magnetization J61 pinned, for example, in the +Y direction, an intermediate layer 62, which does not show any particular magnetization, and a free layer 63, which is changed in magnetization J63 direction depending on size or a direction of the induced magnetic field Hm, are stacked in order. A magnetization easy axis AE63 of the free layer 63 is parallel to a Y axis. FIG. 3(A) shows an unloaded condition where the induced magnetic field Hm is not applied (that is, a condition where an external magnetic field is zero). In this case, the magnetization direction J63 of the free layer 63 is parallel to the magnetization easy axis AE63 of itself, and approximately parallel to the magnetization J61 direction of the pinned layer 61.

The free layer 63 is configured by a soft magnetic material such as nickel-iron alloy (NiFe). The intermediate layer 62 is configured by copper (Cu), and has a top contacting to the pinned layer 61, and a bottom contacting to the free layer 63. The intermediate layer 62 may be configured not only by copper, but also by a nonmagnetic metal having high conductivity such as gold (Au). A top (surface at a side opposite to the intermediate layer 62) of the pinned layer 61 and a bottom (surface at a side opposite to the intermediate layer 62) of the free layer 63 are protected by protective films respectively. An exchange bias field Hin in a magnetization direction J61 (hereinafter, simply mentioned as "exchange bias field Hin") is generated between the pinned layer 61 and the free layer 63, and the layers 61 and 63 interact to each other via the intermediate layer 62. A spin direction of the free layer 63 rotates depending on a space between the pinned layer 61 and the free layer 63 (that is, thickness of the intermediate layer 62), and thereby intensity of the exchange bias field Hin is changed. Therefore, the exchange bias field Hin can be apparently decreased to zero. While FIG. 3(A) shows a configuration example in the case that the free layer 63, intermediate layer 62, and pinned layer 61 are stacked in this order, this is not restrictive, and the layers may be configured in reverse order to this.

FIG. 3(B) shows a detailed configuration of the pinned layer 61. The pinned layer 61 is, for example, in a configuration where a pinned film 64, an antiferromagnetic film 65, and a protective film 66 are stacked in this order from the intermediate layer 62 side. The pinned film 64 is configured by a ferromagnetic material such as cobalt (Co) or cobalt-iron alloy (CoFe). A direction of magnetization shown by the pinned film 64 corresponds to a direction of magnetization J61 of the pinned layer 61 as a whole. On the other hand, the antiferromagnetic film 65 is configured by an antiferromagnetic material such as platinum-manganese alloy (PtMn) or Iridium-manganese alloy (IrMn). The antiferromagnetic film 65 is in a state where spin magnetic moment in a +Y direction and spin magnetic moment in an opposite direction thereto (−Y direction) are completely canceled by each other, and operates to pin the magnetization direction of the pinned film 64 (that is, the direction of magnetization J61 of the pinned layer 61). The protective film 66 includes a relatively chemically stable nonmagnetic material such as tantrum (Ta) or hafnium (Hf), and protects the pinned film 64 or the antiferromagnetic film 65.

In each of the strip-shaped patterns 311, 321, 331 and 341 having the above structure, magnetization J63 of the free layer 63 rotates in response to application of the induced magnetic field Hm, thereby a relative angle between the magnetization J63 and the magnetization J61 is changed. The relative angle is determined by size or a direction of the induced magnetic field Hm. That is, when a component parallel or antiparallel to the magnetization J61 (component in the +Y or −Y direction) of the induced magnetic field Hm is applied to each of the strip-shaped patterns 311, 321, 331 and 341, a direction of the magnetization J63 inclines in the +Y or −Y direction from the no-load state shown in FIG. 3(A), leading to fluctuation in resistance value of each of the strip-shaped patterns 311, 321, 331 and 341. More specifically, when an induced magnetic field Hm in the +Y direction is applied, the magnetization J63 inclines in the +Y direction so as to approach a direction condition parallel to the magnetization J61, resulting in decrease in the resistance value of each of the strip-shaped patterns 311, 321, 331 and 341. Conversely, when an induced magnetic field Hm in the −Y direction is applied, the magnetization J63 inclines in the −Y direction so as to approach a direction condition antiparallel to the magnetization, resulting in increase in the resistance value of each of the strip-shaped patterns 311, 321, 331 and 341.

The yokes 41 to 44 are configured by a soft magnetic material having high permeability such as permalloy (NiFe), cobalt-iron-nickel (CoFeNi) alloy, iron-silicon alloy (FeSi), sendust, nickel-zinc (NiZn) ferrite, or manganese-zinc (MnZn) ferrite, and have a function of guiding the induced magnetic field Hm, which is generated by the signal current Im flowing through the thin film coil 20, to the first to fourth MR elements 31 to 34 respectively. The yokes 41 and 42 face each other with the first and second MR elements 31 and 32 in between in the radial direction (Y-axis direction) of the thin film coil 20. Similarly, the yokes 43 and 44 face each other with the third and fourth MR elements 33 and 34 in between in the radial direction (Y-axis direction) of the thin film coil 20.

The yokes 41 to 44 may be provided in positions being overlapped or not overlapped with the linear region R21 in a stacking direction. However, each of the yokes 41 and 43 at the inner turn side of the thin film coil 20 is desirably provided close to the center position CL in the Y-axis direction of the linear region R21 compared with each of the yokes 42 and 44 at the outer turn side of the thin film coil. That is, regarding a relation between the yokes 41 and 42, as shown in FIG. 2(B), in the Y-axis direction, the center position CL between the innermost turn edge (a side face position at the inner turn side of a linear pattern 21 located in the innermost circumference) 21T1 and the outermost turn edge (a side face position at the outer turn side of a linear pattern 21 located in the outermost circumference) 21T2 of the thin film coil 20 is desirably closer to the yoke 41 at the inner turn side of the thin film coil 20 compared with the yoke 42 at the outer turn side of the thin film coil 20. This is because intensity distribution of the induced magnetic field Hm to be applied to the first and second MR elements 31 and 32 becomes flatter (smaller in deviation) in the Y-axis direction. This is the same in a relation between the yokes 43 and 44. In the above case, in the Y-axis direction, the yoke 41 at the inner turn side is preferably located at an outer turn side with respect to the side face position 21T1 of the linear pattern 21 located in the innermost circumference. That is, as shown in FIG. 2(B), a side face position 41T1 at the inner turn side of the yoke 41 is preferably located at an outer turn side with respect to the side face position 21T1 of the linear pattern 21 in the innermost circumference. This is the same in the yoke 43. Moreover, as shown in FIG. 2(B), the yoke 42 at the outermost circumferential side is desirably designed such that an edge 42T1 at the inner turn side of the yoke is located at an inner turn side with respect to a side face position 21T2 of the linear pattern 21 located at the outermost circumference. This is the same in the yoke 44.

Furthermore, each of the yokes 41 to 44 is designed such that a magnetization easy axis Me of the yoke is in a direction along a winding direction (here, X-axis direction) of the thin film coil 20. Thus, the yokes 41 to 44 are easily magnetized by an induced magnetic field Hm generated by the thin film coil 20 compared with a case that the magnetization easy axis Me is in a different direction, and consequently the induced magnetic field Hm is more efficiently guided to the first to fourth MR elements 31 to 34. In particular, since each of the yokes 41 to 44 extends in a way that a longitudinal direction thereof corresponds to a winding direction of the thin film coil 20, the magnetization easy axis Me has a stable direction due to shape anisotropy.

Furthermore, the magnetic coupler further includes pairs of permanent magnet layers 51 to 54, each permanent magnet layer applying a bias magnetic field to each of the yokes 41 to 44, in a direction along the magnetization easy axis Me thereof. Thus, the yokes 41 to 44 tends to have a single-domain structure, thereby residual magnetization is reduced, and consequently bad influence due to magnetic hysteresis of each of the yokes 41 to 44 itself is suppressed. The pairs of permanent magnet layers 51 to 54 are desirably located in the second layer L2 in the same way as the yokes 41 to 44, and covered with the insulating layer 13 together with the yokes 41 to 44 and the first to fourth MR elements 31 to 34.

Figure 4:
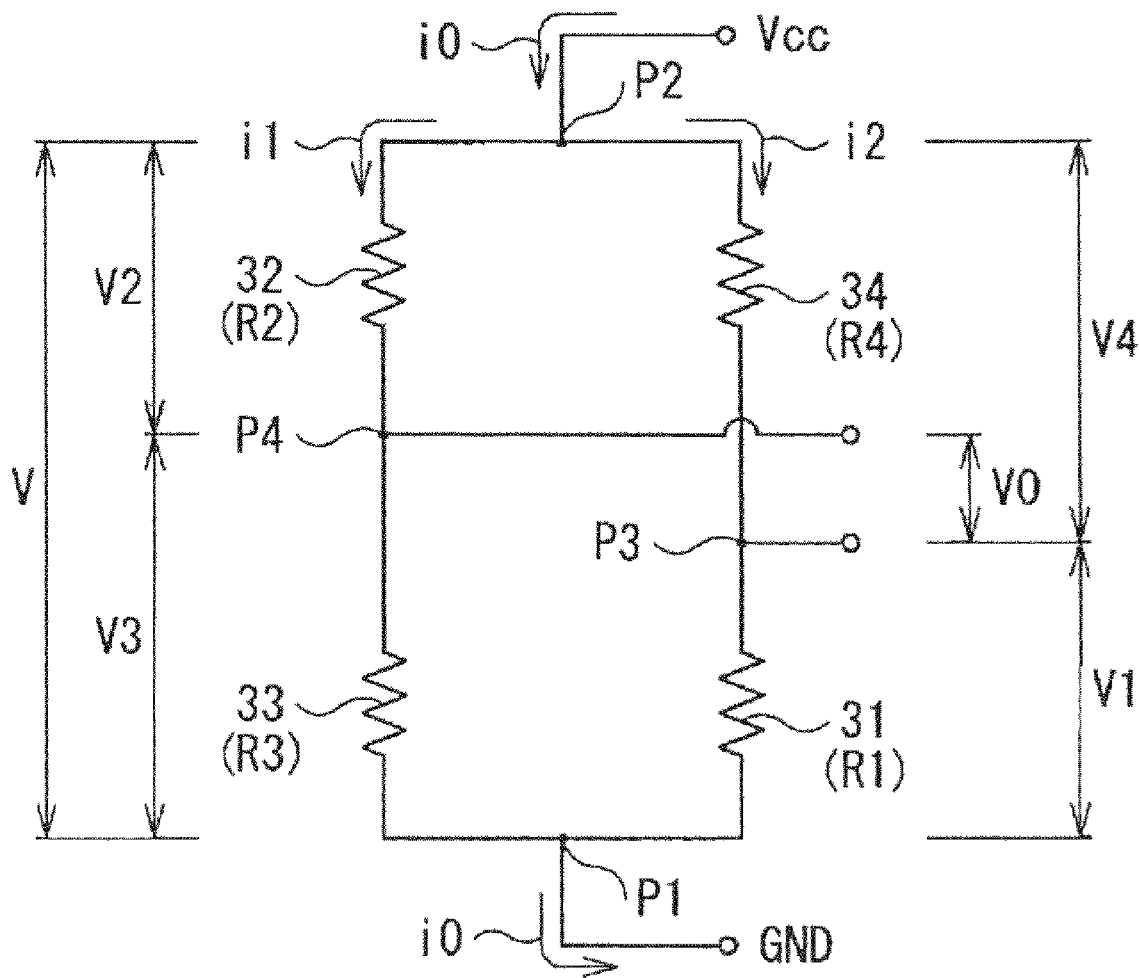
FIG. 4 shows a circuit diagram of the magnetic coupler shown in FIG. 1.

In the magnetic coupler, as shown in FIG. 4, the first to fourth MR elements 31 to 34 are in bridge connection to one another. Specifically, respective ends of the first and third MR elements 31 and 33 are connected at a first connection point P1, respective ends of the second and fourth MR elements 32 and 34 are connected at a second connection point P2, the other end the first MR element 31 and the other end the fourth MR element 34 are connected at a third connection point P3, and the other end the third MR element 33 and the other end the second MR element 32 are connected at a fourth connection point P4. FIG. 4 shows a circuit configuration of the magnetic coupler of the embodiment.

Hereinafter, a method of detecting the induced magnetic field Hm generated by the signal current Im is described with reference to FIG. 4.

In FIG. 4, first, a condition where the induced magnetic field Hm is not applied is considered. Here, when a read current i0 flows into the bridge circuit, resistance values of the first to fourth MR elements 31 to 34 are assumed to be R1 to R4 respectively. The read current i0 from a power supply Vcc is divided into two currents of a read current i1 and a read current i2 at the second connection point P2. Then, the read current i1 that has passed through the second MR element 32 and the third MR element 33, and the read current i2 that has passed through the fourth MR element 34 and the first MR element 31 join at the first connection point P1. In this case, a potential difference V between the second connection point P2 and the first connection point P1 can be expressed as follows.

$$V = i1*R2 + i1*R3 = i2*R4 + i2*R1$$
$$= i1*(R2+R3) = i2*(R4+R1) \quad (1)$$

Moreover, electric potential V3 at the fourth connection point P4 and electric potential V4 at the third connection point P3 can be expressed as follows respectively:

$$V2=V-i1*R2, \text{ and}$$

$$V4=V-i2*R4.$$

Accordingly, a potential difference V0 between the fourth connection point P4 and the third connection point P3 is given as follows.

$$V0 = V4 - V2 \quad (2)$$
$$= (V - i2*R4) - (V - i1*R2)$$
$$= i1*R2 - i2*R4$$

Here, the following is given from the expression (1) and the expression (2).

$$V0 = \{R2/(R2+R3)\}*V - \{R4/(R4+R1)\}*V \quad (3)$$
$$= \{R2/(R2+R3) - R4/(R4+R1)\}*V$$

In the bridge circuit, when the induced magnetic field Hm being an external magnetic field is applied, the potential difference V0 between the fourth connection point P4 and the third connection point P3 expressed by the expression (3) is measured, thereby resistance variation is obtained. Here, when the induced magnetic field Hm is applied, the resistance values R1 to R4 are assumed to change by variations ΔR1 to ΔR4 respectively, that is, when the resistance values R1 to R4 after applying the induced magnetic field Hm are assumed to be expressed as follows respectively:

$$R1=R1+\Delta R1,$$

$$R2=R2+\Delta R2,$$

$$R3=R3+\Delta R3, \text{ and}$$

$$R4=R4+\Delta R4,$$

the potential difference V0 during applying the induced magnetic field Hm is given as follows according to the expression (3).

$$V0=\{(R2+\Delta R2)/(R2+\Delta R2+R3+\Delta R3)-(R4+\Delta R4)/(R4+\Delta R4+R1+\Delta R1)\}*V \quad (4)$$

Since the current sensor is configured such that resistance values R1 and R2 of the first and second MR elements 31 and 32 change in directions opposite to directions where resistance values R3 and R4 of the third and fourth MR elements 33 and 34 change, the variation ΔR4 and the variation ΔR1 cancel each other, and the variation ΔR3 and the variation ΔR2 cancel each other. Therefore, by comparison of the expression (4) before applying the induced magnetic field Hm with the expression after applying that, a denominator does not substantially increase in each term of the expression. On the other hand, since the variation ΔR2 and the variation ΔR4 necessarily have opposite signs to each other, a numerator in each term increases or decreases.

When all of the first to fourth MR elements 31 to 34 are assumed to have completely the same characteristic, that is, when R1=R2=R3=R4=R and ΔR1=ΔR2=-ΔR3=-ΔR4=ΔR are assumed to be established, the expression (4) is given as follows:

$$V0 = \{(R+\Delta R)/(2*R) - (R-\Delta R)/(2*R)\}*V$$
$$= (\Delta R/R)*V.$$

In this way, when the first to fourth MR elements 31 to 34 are used, each of which has a characteristic value such as ΔR/R being known, magnitude of the induced magnetic field Hm can be detected, so that magnitude of the signal current Im generating the induced magnetic field Hm can be estimated. That is, according to the magnetic coupler, the thin film coil 20 is connected to an electric circuit to flow the signal current Im to the thin film coil, and the read current i0 is supplied to the bridge circuit including the first to fourth MR elements 31 to 34, thereby change in signal current Im is shown as change in read current i0. Consequently, signal transmission between a plurality of electric circuits isolated from one another can be performed in a contactless manner.

In the magnetic coupler of the embodiment, the yokes 41 to 44 including a soft magnetic material are disposed at both of the inner turn side and the outer turn side of the thin film coil 20 so as to interpose the first to fourth MR elements 31 to 34 in an in-plane direction respectively. Therefore, reduction in intensity of the induced magnetic field Hm generated by the thin film coil 20 is suppressed, and the induced magnetic field can be efficiently applied to the first to fourth MR elements 31 to 34. Accordingly, even if a smaller signal current Im flows, the induced magnetic field Hm can be accurately detected. Therefore, power saving can be significantly achieved compared with the past. In particular, since the yokes 41 to 44 are disposed in the second layer L2 in the same way as the first to fourth MR elements 31 to 34, the induced magnetic field Hm is efficiently applied to the first to fourth MR elements 31 to 34 compared with a case that the yokes exist in a layer other than the second layer L2. In Published Japanese Translation of a PCT patent application No. 2003-526083, description is made on a magnetic material layer being disposed near both of a coil and a current sensor, and acting as a magnetic field concentrator. However, since a specific layout position of the magnetic material layer is not shown therein, whether an adequate effect is obtained is unclear.

Moreover, the magnetic coupler of the embodiment is designed such that the thin film coil 20 includes the plurality of linear patterns 21, and the first to fourth MR elements 31 to 34 are provided in the positions corresponding to the linear region R21 occupied by the linear patterns in a stacking direction. Therefore, in the magnetic coupler, stable detection operation is exhibited compared with a case that the MR elements are provided in positions corresponding to the curved region R22 occupied by the curved patterns 22.

Moreover, in the magnetic coupler of the embodiment, each center position CL between the innermost turn edge and the outermost turn edge of the thin film coil 20 in the radial direction of the thin film coil 20 is closer to the yoke 41 or 43 at the inner turn side of the thin film coil 20 compared with the yoke 42 or 44 at the outer turn side of the thin film coil 20. Therefore, an induced magnetic field Hm being small in deviation of intensity distribution in the radial direction is applied to the first to fourth MR elements 31 to 34. Consequently, in the strip-shaped patterns 311, 321, 331 and 341 extending in the radial direction of the thin film coil 20, magnetization J63 of the free layer 63 is oriented approximately uniformly depending on the induced magnetic field Hm over the whole area in the radial direction, and consequently more accurate signal transmission can be performed.

Moreover, in the magnetic coupler of the embodiment, since the first to fourth MR elements 31 to 34 are used and interconnected into bridge connection, change in signal current Im flowing through the thin film coil 20 can be more accurately detected.

Second Embodiment

Figure 5A:
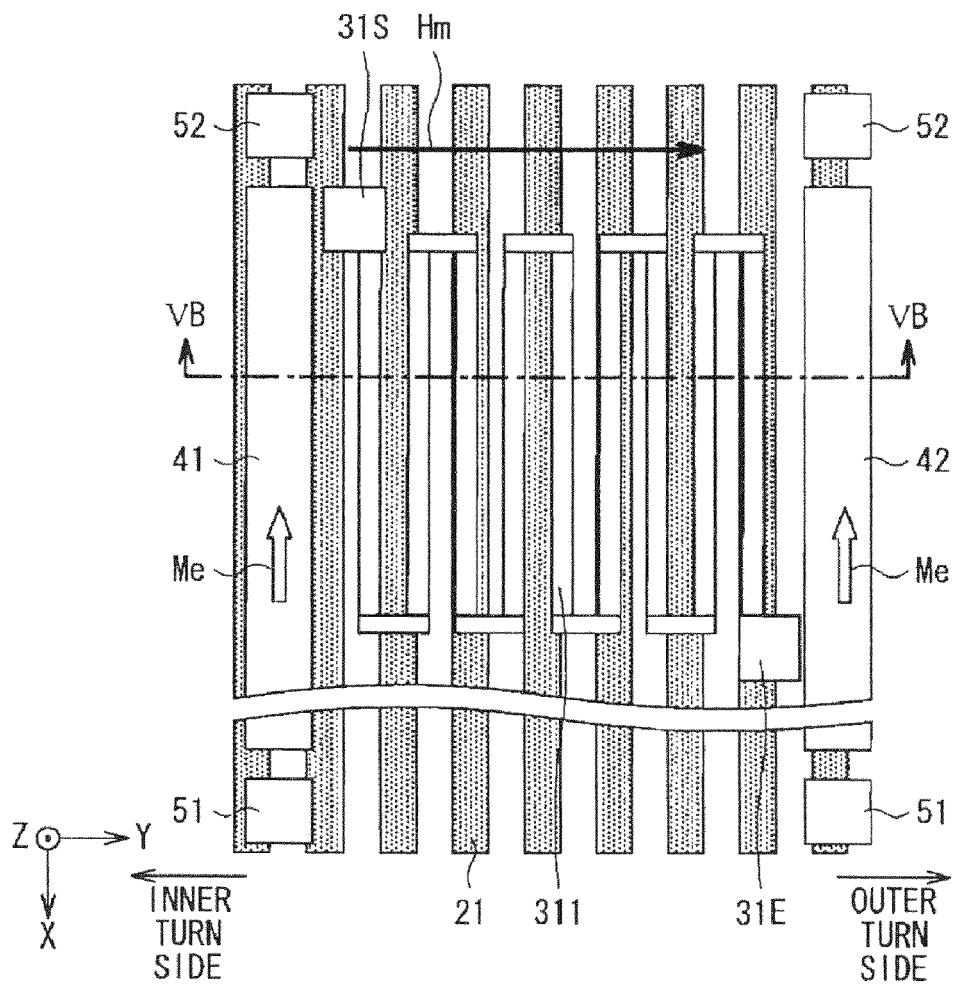
FIGS. 5A to 5B show a plan view and a section view of a relevant-part configuration of a magnetic coupler as a second embodiment of the invention.
Figure 5B:
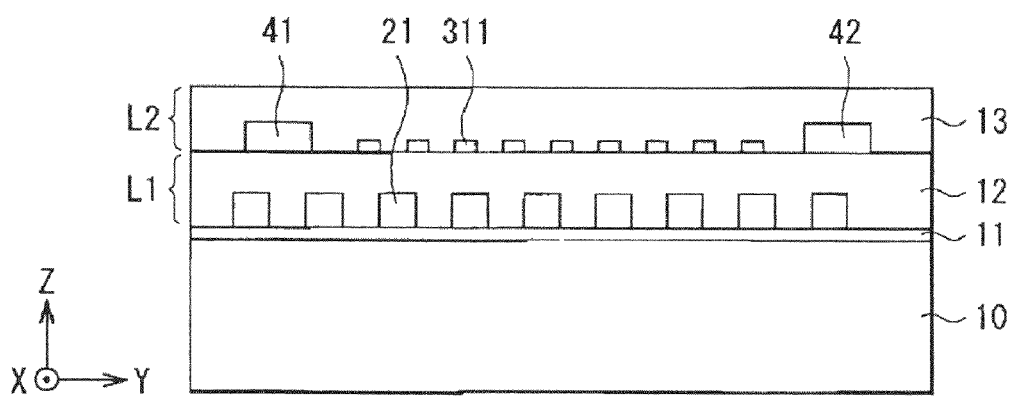
Figure 6:
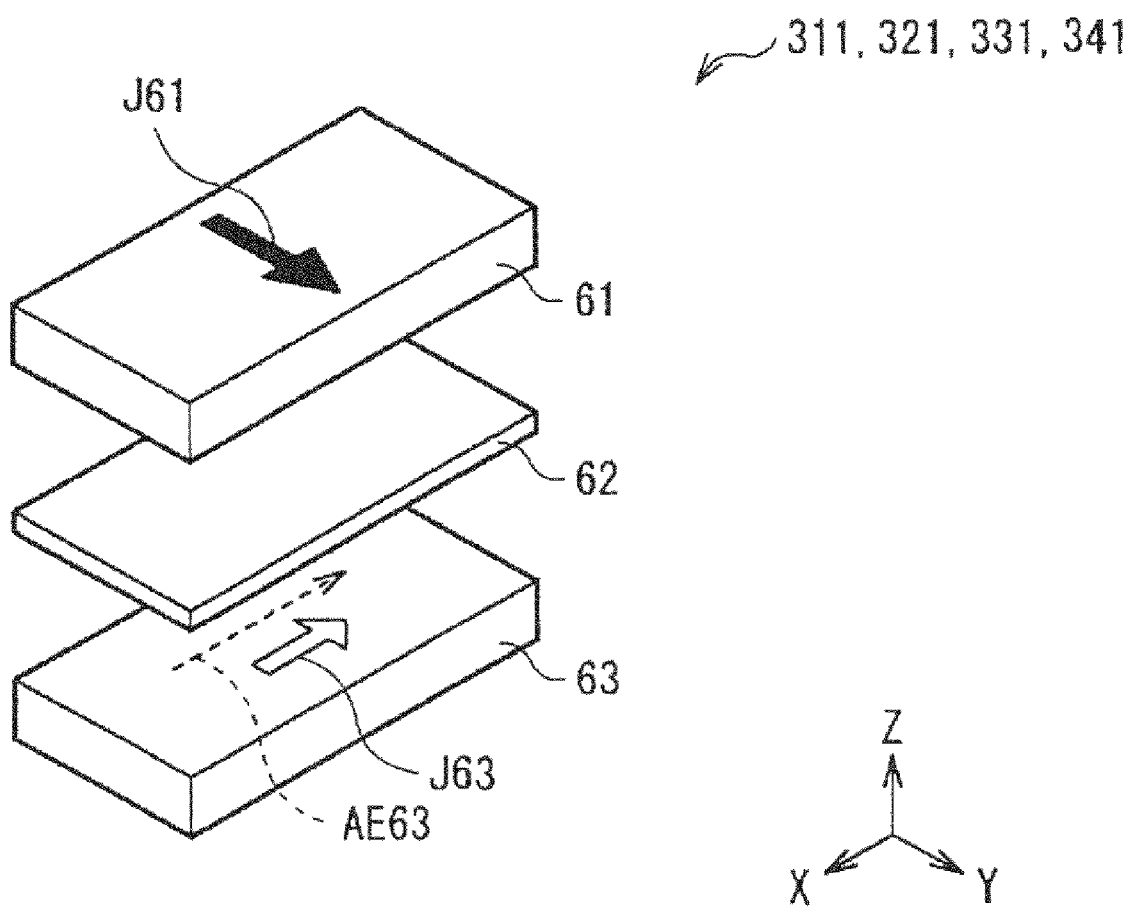
FIG. 6 shows an exploded perspective view showing a configuration of a strip-shaped pattern of the magnetic coupler shown in FIG. 5.

Next, a magnetic coupler as a second embodiment of the invention is described with reference to FIGS. 5A to 5B and FIG. 6. FIG. 5A shows a planar configuration of a relevant part (periphery of the first MR element 31) of the magnetic coupler of the embodiment, and is corresponding to FIG. 2A in the first embodiment. FIG. 5B shows a section view seen in an arrow direction along a line VB-VB in FIG. 5A, and is corresponding to FIG. 2B in the first embodiment.

In the magnetic coupler, unlike the magnetic coupler of the first embodiment, the strip-shaped patterns 311, 321, 331 and 341 included in the first to fourth MR elements 31 to 34 extend in the X-axis direction rather than the Y-axis direction. In the strip-shaped patterns 311, 321, 331 and 341, as shown in FIG. 6, magnetization J61 of the pinned layer 61 is oriented in a +Y direction, and magnetization J63 of the free layer 63 in a no-load state is oriented in a −X direction.

Even in the magnetic coupler of the embodiment, the same advantage as in the first embodiment is obtained. In particular, the yokes 41 to 44 exist, leading to increase in intensity of the induced magnetic field Hm to be applied to the plurality of strip-shaped patterns 311, 321, 331 and 341, in addition, leading to reduction in deviation in the induced magnetic field, which reduces variation in resistance value between respective, adjacent strip-shaped patterns 311, 321, 331 and 341. Consequently, more accurate signal transmission can be performed.

EXAMPLES

Specific examples of an embodiment of the invention are described.

First Example

Figure 7:
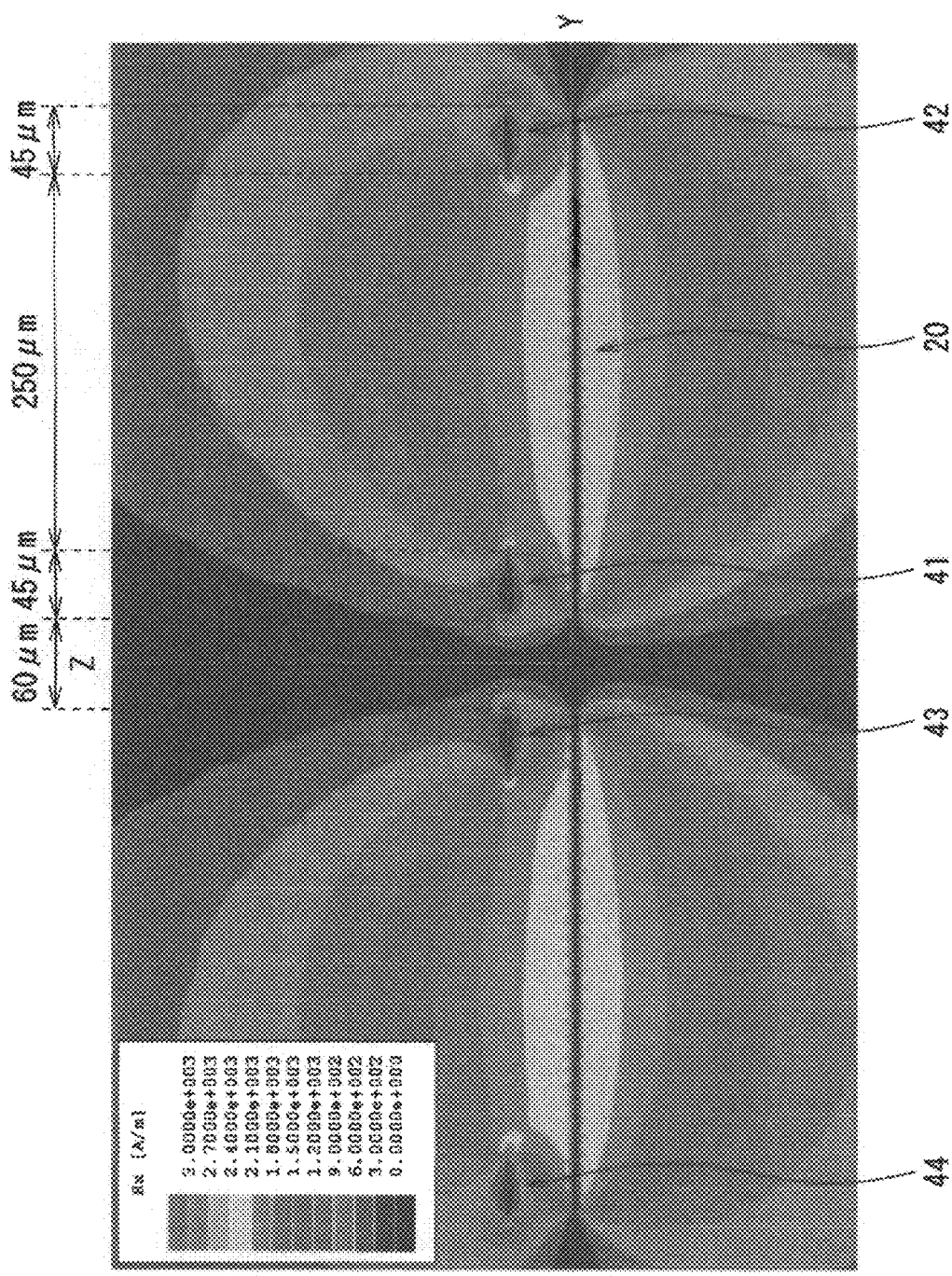
FIG. 7 shows a characteristic diagram showing intensity distribution of an induced magnetic field Hm on a section (Y-Z plane) perpendicular to a winding direction in the first example of the magnetic coupler shown in FIG. 1.

FIG. 7 shows a characteristic diagram showing intensity distribution of the induced magnetic field Hm on a section (Y-Z plane) perpendicular to the winding direction in the magnetic coupler shown in FIG. 1 and FIGS. 2A to 2B. In FIG. 7, a horizontal axis corresponds to the Y axis, and a vertical axis corresponds to the X axis.

Here, the thin film coil 20 was made to have the number of turns of 30, and formed into a three-layer structure in which two conductive layers including copper face each other with an insulating layer 2 μm in thickness in between. Each conductive layer of the thin film coil 20 was made such that thickness of each turn was 2 μm, width of each turn was 8.5 μm, and an interval between respective turns was 2.5 μm. In addition, each conductive layer of the thin film coil 20 was designed to be flowed with a signal current Im of 27 mA.

On the other hand, the yokes 41 to 44 were configured in the same way. Specifically, each yoke was 0.15 μm in thickness and 45 μm in width, and configured by permalloy, and had a magnetic permeability p of 2000. Each of intervals between the yokes 41 and 43 at the inner turn side and the yokes 42 and 44 at the outer turn side was 250 μm, and an interval between the yokes 41 and 43 was 60 μm. A distance in a stacking direction (Z-axis direction) between the thin film coil 20 and the yokes 41 to 44 was 40 μm.

As shown in FIG. 7, at a lower side of the thin film coil 20, since the yokes are not provided, intensity of the induced magnetic field Hm decreases monotonously with distance from the thin film coil 20. In addition, in the Y-axis direction, intensity of the induced magnetic field Hm is largest at the center position CL, and decreases with approaching the winding center or the winding periphery, leading to significant deviation in intensity distribution. On the contrary, at an upper side of the thin film coil 20, it can be confirmed that since the yokes 41 to 44 are provided, an induced magnetic field Hm to be applied to the first to fourth MR elements 31 to 34 is stronger than an induced magnetic field Hm at a position by the same distance below (in a −Z direction) the thin film coil 20. Furthermore, it is seen that since the yokes 41 to 44 exist, the induced magnetic field Hm to be applied to the first to fourth MR elements 31 to 34 is made uniform in the Y-axis direction, or distributed with small deviation.

Figure 8:
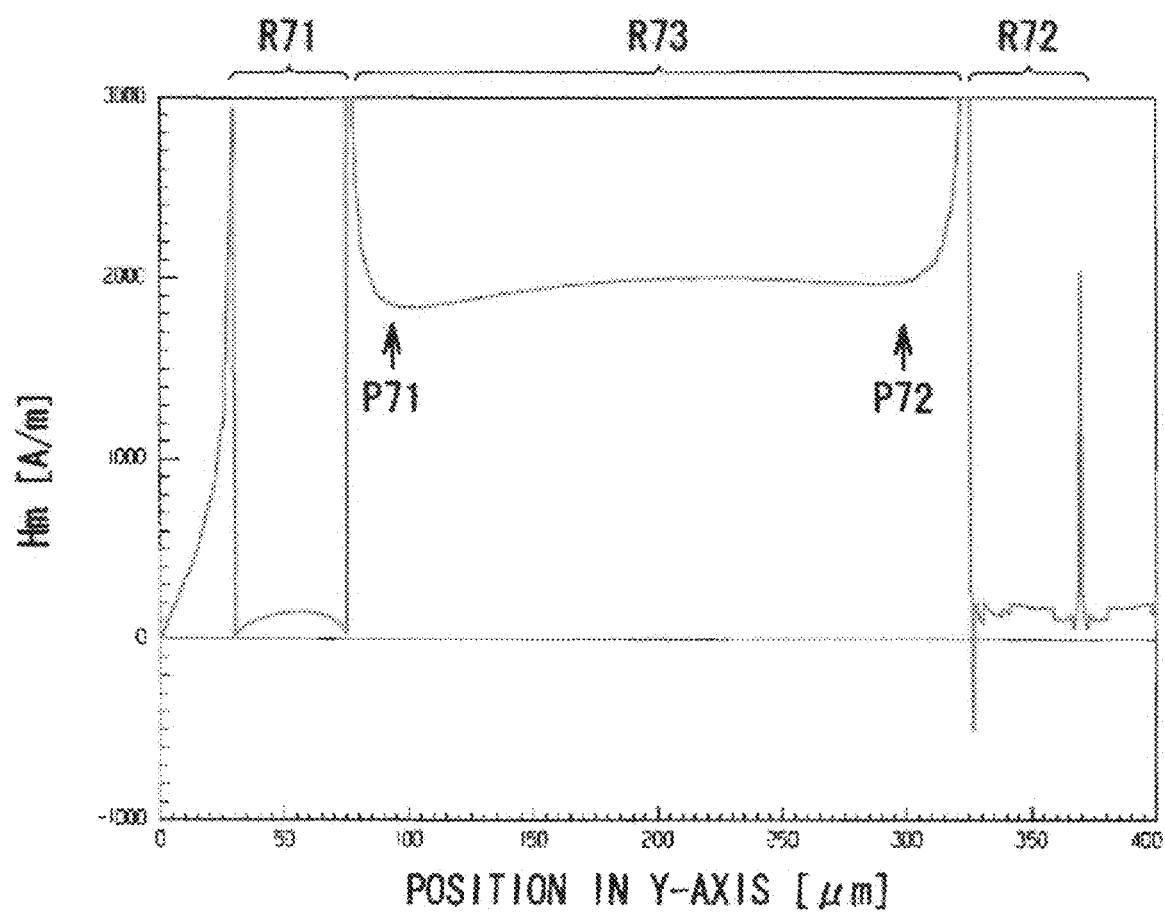
FIG. 8 shows a diagram showing intensity distribution of the induced magnetic field Hm in a Y-axis direction in a second layer L2 in the first example of the magnetic coupler shown in FIG. 1.

However, in FIG. 7, since the yoke 41 and the yoke 42 are equidistant from each center position CL, and the yoke 43 and the yoke 44 are equidistant from each center position CL, intensity of the induced magnetic field Hm is large in a region close to the yoke 42 or 44 compared with a region close to the yoke 41 or 43. FIG. 8 shows a graph for facilitating understanding of such an aspect, showing intensity distribution of the induced magnetic field Hm in the Y-axis direction in the second layer L2. In FIG. 8, a horizontal axis shows a position in a radial direction (Y-axis direction) with a position of a winding center of the thin film coil 20 (middle position between the yoke 41 and the yoke 43) as an origin (0), and a vertical axis shows the induced magnetic field Hm. In the figure, 0 on the horizontal axis shows the position of the winding center of the thin film coil 20 (in addition, the middle position between the yoke 41 and the yoke 43). A region R 71 corresponds to positions at which the yokes 41 and 43 exist, a region R 72 corresponds to positions at which the yokes 42 and 44 exist, and a region R 73 between the regions R71 and R72 corresponds to positions at which the first to fourth MR elements 31 to 34 are disposed. In FIG. 8, it is seen that an induced magnetic field Hm at a position indicated by an arrow P72 is larger than an induced magnetic field Hm at a position indicated by an arrow P71.

Second Example

Figure 9:
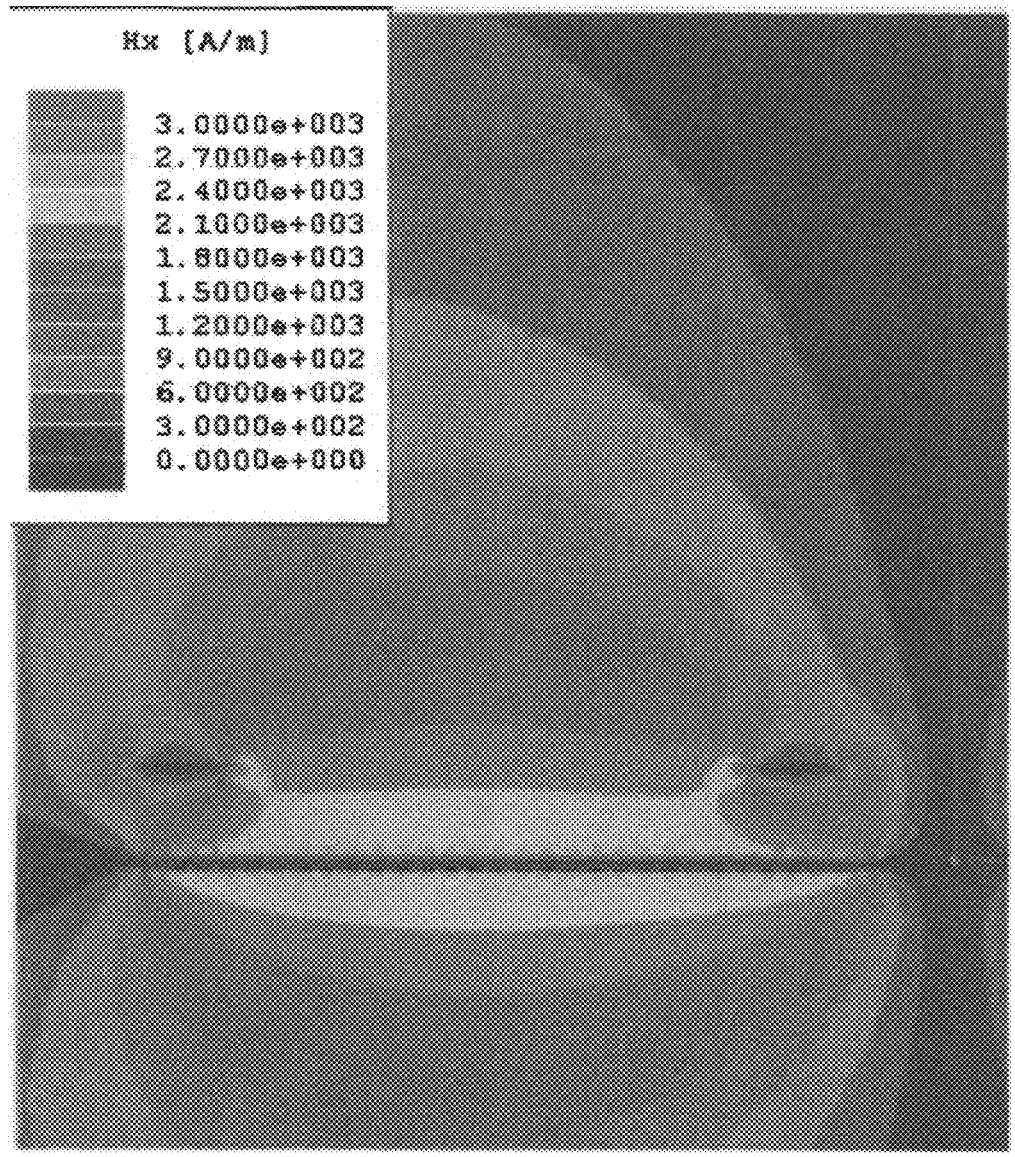
FIG. 9 shows a characteristic diagram showing intensity distribution of an induced magnetic field Hm on a section (Y-Z plane) perpendicular to a winding direction in the second example of the magnetic coupler shown in FIG. 1.
Figure 10:
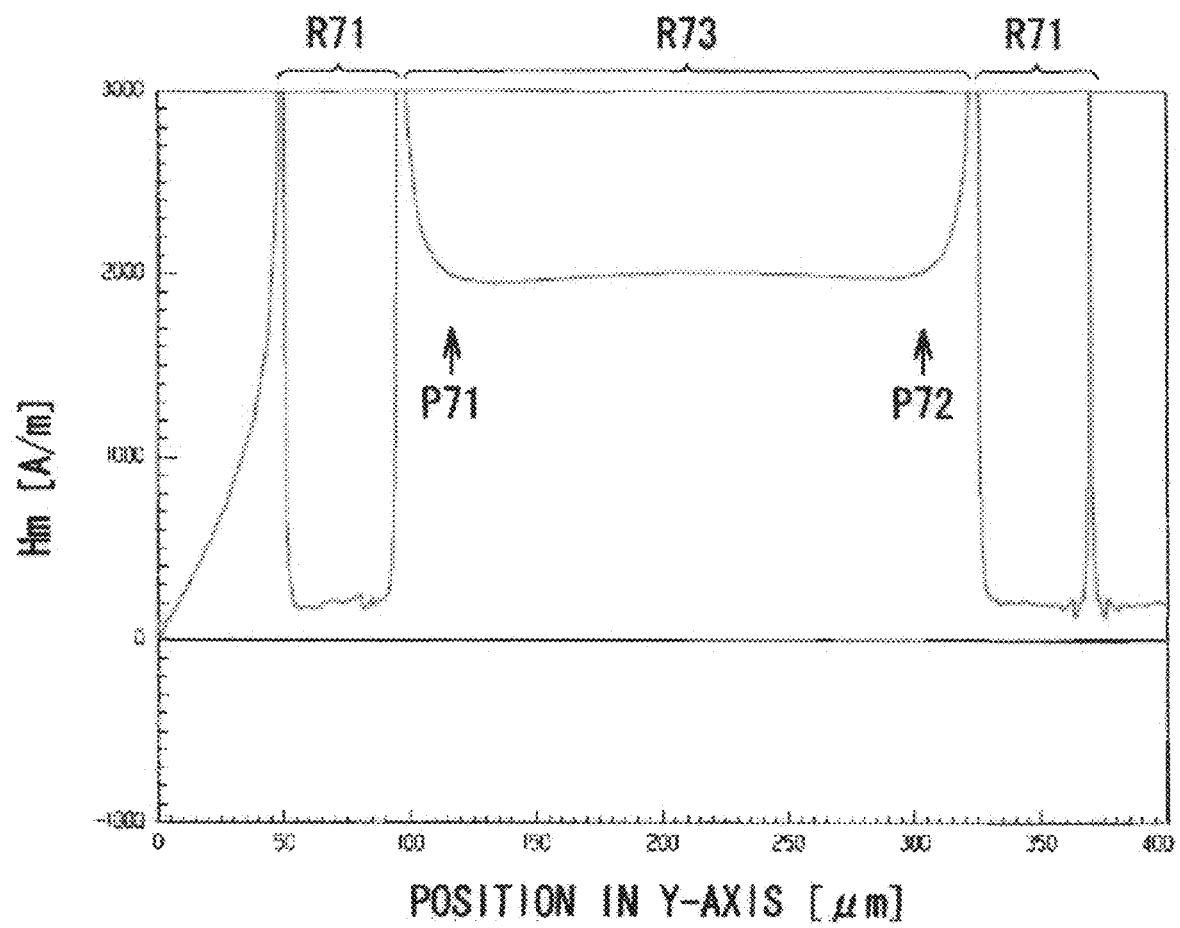
FIG. 10 shows a diagram showing intensity distribution of the induced magnetic field Hm in a Y-axis direction in a second layer L2 in the second example of the magnetic coupler shown in FIG. 1.

Thus, investigation was made on intensity distribution of the induced magnetic field Hm in the case that positions of the yokes 41 and 43 are moved by 20 μm to the outer turn side respectively. FIGS. 9 and 10 show a result of the investigation. FIG. 9 is corresponding to a left half of FIG. 7, and FIG. 10 is corresponding to FIG. 8.

As shown in FIGS. 9 and 10, positions of the yokes 41 and 43 were moved to the outer turn side respectively, thereby approximately flat intensity distribution of the induced magnetic field Hm was shown in the region R 73 interposed between the yoke 41 or 43 and the yoke 42 or 44 (the induced magnetic field Hm indicated by the arrow P71 became approximately equal to the induced magnetic field Hm indicated by the arrow P72). That is, in the magnetic coupler of the invention, it was able to be confirmed that the center position CL between the innermost turn edge and the outermost turn edge of the thin film coil 20 in the radial direction of the thin film coil 20 was made to be close to the yoke 41 or 43 at the inner turn side of the thin film coil 20 rather than the yoke 42 or 44 at the outer turn side of the thin film coil 20, thereby an induced magnetic field Hm having flatter intensity distribution was able to be applied to the first to fourth MR elements 31 to 34.

Hereinbefore, the invention has been described with several embodiments and examples. However, the invention is not limited to the embodiments and the examples, and can be variously altered or modified. For example, in the embodiments and the examples, description was made on the case that a giant magnetoresistive element (GMR element) was used as each of the first to fourth magnetoresistive elements. However, this is not limitative, and for example, a tunnel magnetoresistive element (TMR element) may be used. In addition, while an example where four magnetoresistive elements were provided was given in the embodiments and the examples, the number of the elements is not particularly limited.

Figure 11:
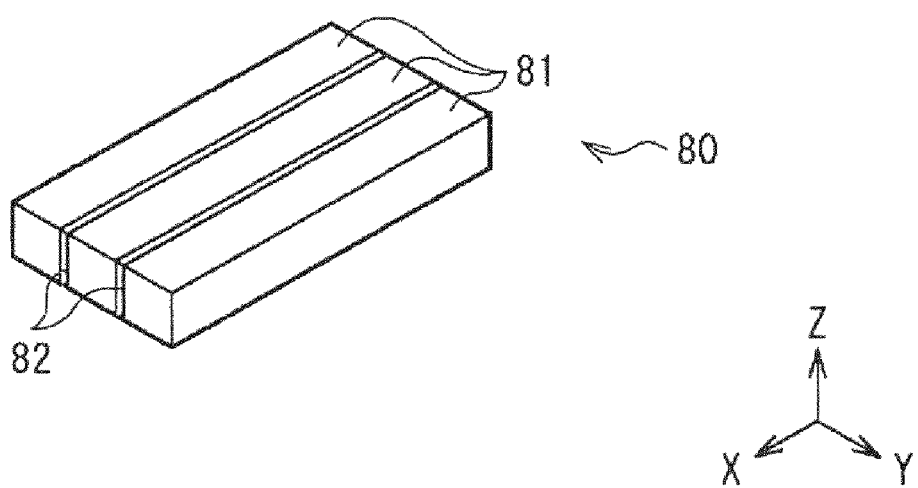
FIG. 11 shows a perspective view showing a first modification of a yoke of the magnetic coupler of an embodiment of the invention.

While a yoke having an integral structure was used in the embodiments and the examples, this is not limitative. For example, as seen in a yoke 80 shown in FIG. 11, a yoke may include a plurality of yoke patterns 81 that extend along the winding direction (here, X-axis direction) of the thin film coil 20 respectively, and are dividedly arranged so as to be adjacent to one another in the radial direction (here, Y-axis direction) of the thin film coil 20. Each yoke pattern 81 is configured by a soft magnetic material having high magnetic permeability, and has a magnetization easy axis along a longitudinal direction (X-axis direction) thereof. Moreover, a non-magnetic layer 82 is provided between the respective yoke patterns 81. In such a case, shape magnetic anisotropy of a yoke as a whole is improved compared with a yoke having an integral structure, thereby an induced magnetic field to be applied to the MR elements is expected to be stabilized.

Figure 12:
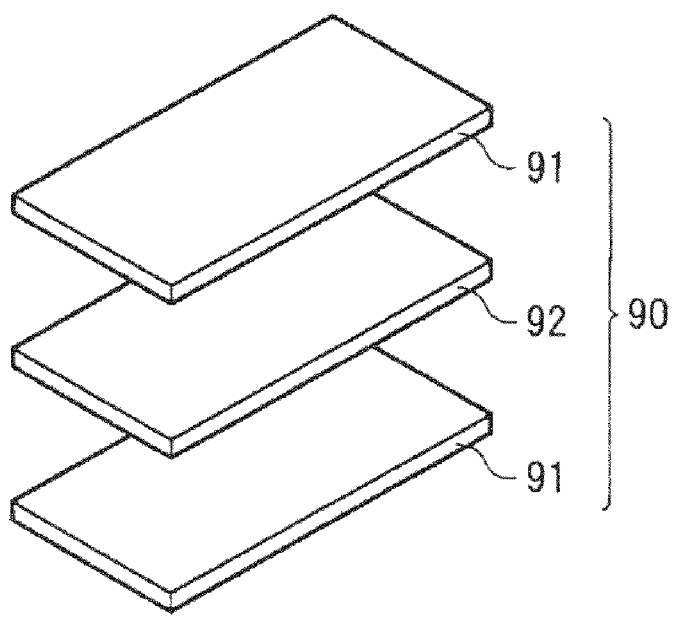
FIG. 12 shows an exploded perspective view showing a second modification of the yoke of the magnetic coupler of an embodiment of the invention.

Alternatively, as seen in a yoke 90 shown in FIG. 12, a yoke preferably has a stacked structure in which soft magnetic layers 91 and nonmagnetic layers 92 are alternately stacked in a stacking direction (here, Z-axis direction). This is because while a certain degree of magnetic volume (magnetic thickness) is secured, generation of a demagnetization field at a longitudinal end of the yoke is suppressed compared with a yoke having an integral structure, and consequently intensity of an induced magnetic field to be applied to the MR elements is improved.

In the embodiments and the examples, for example, as shown in FIG. 2(B), description was made on a case that the first layer L1 and the second layer L2 were provided in a manner of contacting to each other. However, this is not limitative, and the layers may be provided in a manner of being separated from each other. That is, another layer (a third layer) may be provided between the first layer L1 and the second layer L2. However, the MR elements 31 to 34 needs to be able to detect the induced magnetic field Hm generated by the signal current Im flowing through the thin film coil 20. Furthermore, while the first layer L1 and the second layer L2 were stacked in order from a base 10 side, a stacking order of the layers is not limited to this.

Figure 13:
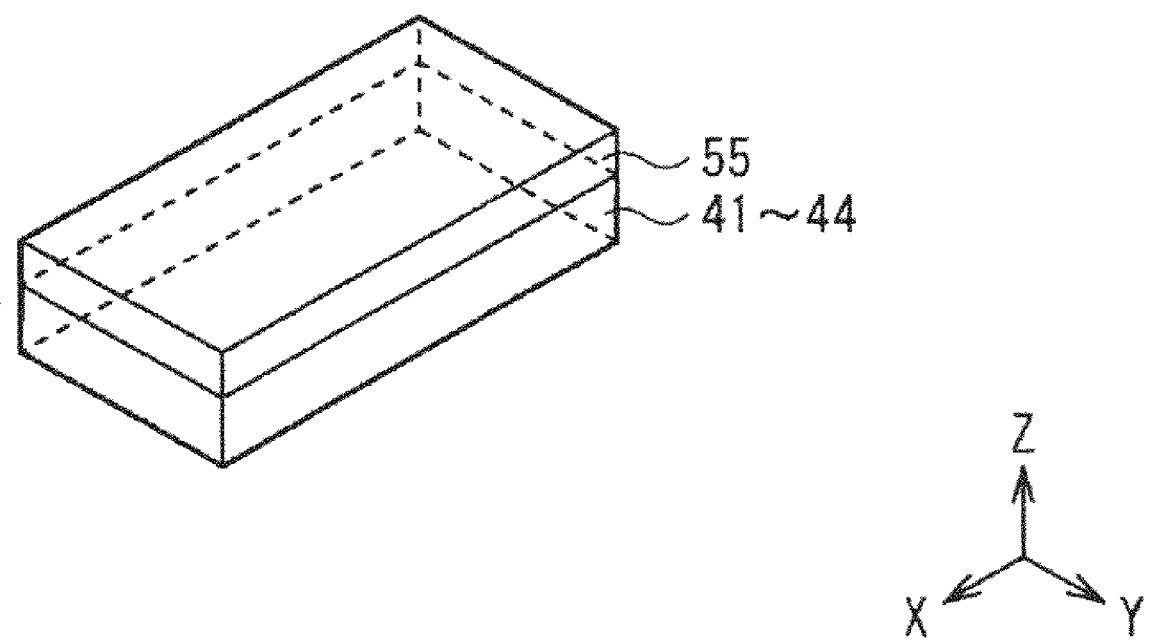
FIG. 13 shows a perspective view showing a configuration example in which an antiferromagnetic layer for achieving a single-domain structure is provided on a yoke of the magnetic coupler of an embodiment of the invention.

In the embodiments and the examples, description was made on an example where the pairs of permanent magnet layers 51 to 54 were provided, thereby a predetermined bias magnetic field was applied to each yoke. However, a different configuration such as a configuration as shown in FIG. 13 may be used instead of providing the permanent magnet layers 51 to 54. That is, an antiferromagnetic layer 55 may be stacked, the antiferromagnetic layer having the spin magnetic moment in +X and −X directions along the magnetization easy axis Me of each of the yokes 41 to 44. For example, the antiferromagnetic layer may be stacked in a manner of contacting to a top of each of the yokes 41 to 44 so as to achieve a single-domain structure of each of the yokes 41 to 44.

INDUSTRIAL APPLICABILITY

The magnetic coupler of an embodiment of the invention can be used in the case of performing isolation between input and output or noise cut, for example, as a signal isolator for communication. Specifically, the magnetic coupler is considered to be used, for example, as a component for performing signal isolation between a primary side and a secondary side of a switching power supply. While a photo-coupler or a pulse transformer has been used for the signal isolator for communication in the past, the magnetic coupler of an embodiment of the invention can be expected to be used as a substitute of the photo-coupler or the like because the magnetic coupler has advantages of superior response (little delay in signal transmission), wide available temperature range, small aging deterioration and the like.

It should be understood by those skilled in the art that various modifications, combinations, sub-combinations and alterations may occur depending on design requirements and other factors insofar as they are within the scope of the appended claims or the equivalent thereof.

What is claimed is:

1. A magnetic coupler, comprising:
    a thin film coil wound in a first layer,
    a plurality of magnetoresistive elements located in a second layer different from the first layer to detect an induced magnetic field generated by a current flowing through the thin film coil, and
    a plurality of yokes spaced apart from the plurality of magnetoresistive elements, located only in the second layer without overlapping one another, with a first yoke disposed to an inner turn side and a second yoke to an outer turn of the thin film coil, with a portion of the plurality of magnetoresistive elements in between, in a radial direction of the thin film coil.

2. The magnetic coupler according to claim 1:
    wherein
    the thin film coil has a linear region including a plurality of linear patterns which linearly extends in a winding direction of the thin film coil, and
    each of the plurality of magnetoresistive elements is provided in a position corresponding to the linear region.

3. The magnetic coupler according to claim 1:
wherein
in the radial direction of the thin film coil, a distance from the first yoke at the inner turn side to a middle point is smaller than a distance from the second yoke at the outer turn side to the middle point, the middle point being defined as a median point between an innermost turn edge and an outermost turn edge of the thin film coil.

4. The magnetic coupler according to claim 1:
wherein
in the radial direction of the thin film coil, the first yoke at the inner turn side is located at an outer turn side of the innermost turn edge of the thin film coil.

5. The magnetic coupler according to claim 1:
wherein
in the radial direction of the thin film coil, an inner side edge of the second yoke at the outer turn side is located at an inner side of the outermost turn edge of the thin film coil.

6. The magnetic coupler according to claim 1:
wherein
each yoke has a magnetization easy axis in a direction along a winding direction of the thin film coil.

7. The magnetic coupler according to claim 6:
wherein
said each yoke extends such that a longitudinal direction of said each yoke corresponds to the winding direction of the thin film coil.

8. The magnetic coupler according to claim 1:
wherein
each yoke includes a plurality of yoke patterns dividedly arranged to be adjacent to one another in the radial direction of the thin film coil, each of the yoke patterns extending along the winding direction of the thin film coil.

9. The magnetic coupler according to claim 1:
wherein
each yoke has a stacked structure having soft magnetic layers and insulating layers alternately stacked in the stacking direction.

10. The magnetic coupler according to claim 1:
wherein
the magnetic coupler further includes an antiferromagnetic layer having magnetic moment in a direction along a magnetization easy axis of the yoke.

11. The magnetic coupler according to claim 1:
wherein
the magnetic coupler further includes ferromagnetic layers applying a bias magnetic field to the yoke in a direction along a magnetization easy axis of the yoke.

12. The magnetic coupler according to claim 1:
wherein
each magnetoresistive element has a plurality of strip-shaped patterns extending along a winding direction or in the radial direction of the thin film coil, and
the plurality of strip-shaped patterns are connected in series to one another.

13. A magnetic coupler,
comprising:
a thin film coil wound in a first layer,
first to fourth magnetoresistive elements located in a second layer different from the first layer, and having resistance values which are variable depending on an induced magnetic field generated by a current flowing through the thin film coil respectively, and
a plurality of yokes spaced apart from the first to fourth magnetoresistive elements, located only in the second layer without overlapping one another, a first and second yoke disposed to an inner turn side and third and fourth yoke an outer turn side of the thin film coil, with the first and second magnetoresistive elements in between the first and third yokes and the third and fourth magnetoresistive elements in between the second and fourth yokes, in a radial direction of the thin film coil;
wherein
a resistance value of each of the first and second magnetoresistive elements changes in a direction opposite to an up-down direction of a resistance value of the third and fourth magnetoresistive elements, respectively, in response to changes of the induced magnetic field.

* * * * *